United States Patent [19]
Chu

[11] Patent Number: 6,124,159
[45] Date of Patent: Sep. 26, 2000

[54] METHOD FOR INTEGRATING HIGH-VOLTAGE DEVICE AND LOW-VOLTAGE DEVICE

[75] Inventor: Tung-Yuan Chu, Taoyuan Hsien, Taiwan

[73] Assignee: United Microelectronics Corp., Hsinchu, Taiwan

[21] Appl. No.: 09/388,979

[22] Filed: Sep. 2, 1999

[51] Int. Cl.$^7$ ............................................. H01L 21/8238
[52] U.S. Cl. ........................ 438/225; 438/275; 438/297; 438/298
[58] Field of Search ................................. 438/225, 200, 438/275, 276, 278, 297, 298, 299, 301, 439, 452; 257/500, 501, 499

[56] References Cited

U.S. PATENT DOCUMENTS

| | | | |
|---|---|---|---|
| 4,590,663 | 5/1986 | Haken | 438/231 |
| 5,024,960 | 6/1991 | Haken | 438/200 |
| 5,254,487 | 10/1993 | Tamagawa | 438/217 |
| 5,834,352 | 11/1998 | Choi | 438/275 |

*Primary Examiner*—Donald L. Monin, Jr.
*Assistant Examiner*—Hoai Pham
*Attorney, Agent, or Firm*—Charles C. H. Wu; Charles C. H. Wu & Associates, APC

[57] ABSTRACT

A method for integrating a high-voltage device and a low-voltage device. A substrate has a high-voltage device region, a low-voltage device region and a scribe region, wherein a patterned insulating layer is formed on the substrate in the high-voltage device region and the scribe region. A grade region is formed in the substrate exposed by the patterned insulating layer in the high-voltage device region. A plurality of protuberances is formed on the substrate exposed by the patterned insulating layer in the high-voltage device region and in the scribe region. The patterned insulating layer and the protuberances are removed to form recesses at locations of the protuberances. A first gate structure and a second gate structure are respectively formed on the substrate between the grade region in the high-voltage device region and on the substrate in the low-voltage device region while using the recesses as alignment marks. A lightly doped region is formed in the substrate exposed by the second gate structure in the low-voltage device region. Spacers are formed on sidewalls of the first gate structure and the second gate structure. A heavily doped region and a source/drain region are respectively formed in the substrate exposed by the spacer in the high-voltage device region and the low-voltage device region, wherein the heavily doped region and the grade region together form a double diffused drain region.

14 Claims, 3 Drawing Sheets

METHOD FOR INTEGRATING HIGH-VOLTAGE DEVICE AND LOW-VOLTAGE DEVICE

BACKGROUND OF THE INVENTION

1. Field of Invention

The present invention relates to a method of manufacturing a semiconductor device. More particularly, the present invention relates to a method for integrating a high-voltage device and a low-voltage device.

2. Description of Related Art

Typically, in a low-voltage logic circuit, it is necessary to use a high-voltage device to transfer the proper voltages into different electronic devices. The high voltage device is located at the interface between the low-voltage logic circuit and the electronic devices. Hence, in order to decrease the cost and to obtain the demand voltages for driving different electronic devices, it is important to develop a method for integrating a low-voltage device and a high-voltage device.

Conventionally, the method of forming a high-voltage device comprises the steps of forming a polysilicon gate on a substrate, and then using the polysilicon gate as a mask and forming a source/drain region with a double-diffused drain (DDD) structure in a self-aligned process. Commonly, in order to suppress the hot electron effect and to increase the breakdown voltage in the source/drain region, a lightly doped region is formed in the substrate under the source/drain region and the isolation region, and then a high-temperature drive in process is performed to form the DDD structure. Therefore, the high-voltage device can be normally operated under a high voltage situation. However, in the procedure for integrating the high-voltage device and the low-voltage device, the structures of the high-voltage device and the low-voltage devices and the heat budgets for the high-voltage device and the low-voltage devices are different. When the grade region, that is, the lightly doped region, is formed in the substrate and a drive in process is performed to form a DDD structure, the electrical property of low-voltage device fluctuates. Therefore, it leads to an electrical instability problem of the low-voltage device.

SUMMARY OF THE INVENTION

The invention provides a method for integrating a high-voltage device and a low-voltage device. A substrate having a high-voltage device region, a low-voltage device region and a scribe region is provided. The high-voltage device region is isolated from the low-voltage device region and a patterned insulating layer is formed on the substrate in the high-voltage device region and the scribe region. A grade region is formed in the substrate exposed by the patterned insulating layer in the high-voltage device region. A plurality of protuberances is formed on the substrate exposed by the patterned insulating layer in the high-voltage device region and in the scribe region. The patterned insulating layer and the protuberances are removed to form recesses at locations of the protuberances. A first gate structure and a second gate structure are respectively formed on the substrate between the grade region in the high-voltage device region and on the substrate in the low-voltage device region while using the protuberances as alignment marks. A lightly doped region is formed in the substrate exposed by the second gate structure in the low-voltage device region. Spacers are formed on sidewalls of the first gate structure and the second gate structure. A heavily doped region and a source/drain region are respectively formed in the substrate exposed by the spacer in the high-voltage device region and the low-voltage device region, wherein the heavily doped region and the grade region together form a double diffused drain region.

As embodied and broadly described herein, the invention provides a method for integrating a high-voltage device and a low-voltage device. The grade region in the high-voltage device region and the recesses in the scribe region are formed in a self-aligned process with the same patterned insulating layer as a mask layer, so that the recesses can be used as alignment marks and a vernier in the subsequent adjusting implantation and formation of a gate structure. Additionally, the grade region is formed before the gate structure. Therefore, the low-voltage device will not be affected by the high temperature drive-in process and the electrical instability problem can be overcome.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A through 1E are schematic, cross-sectional views of the process for integrating a high-voltage device and a low-voltage device in a preferred embodiment according to the invention.

Figure 1A:
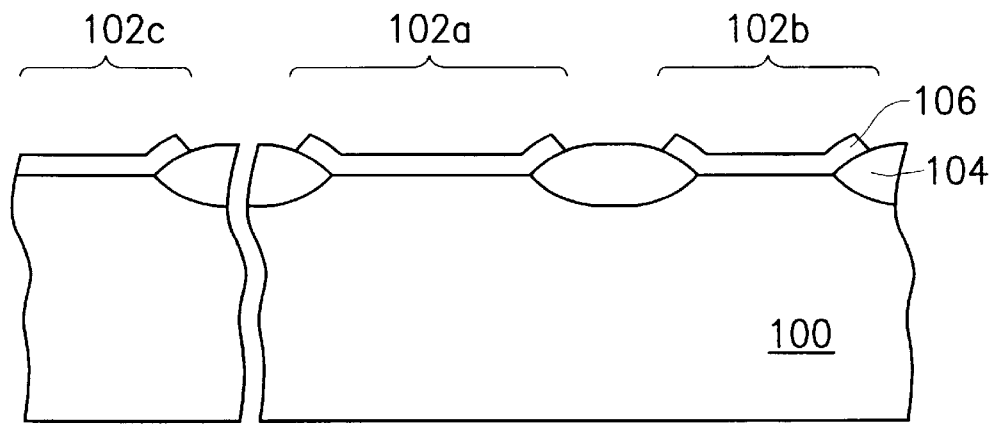
FIGS. 1A through 1E are schematic, cross-sectional views of the process for integrating a high-voltage device and a low-voltage device in a preferred embodiment according to the invention.

As shown in FIG. 1A, a substrate 100 having a patterned insulating layer 106 formed thereon is provided. The insulating layer 106 can be formed from silicon nitride by low-pressure chemical vapor deposition (LPCVD), for example. The patterned insulating layer 106 exposes a portion of the substrate 100 used to subsequently form an isolation region. An oxidation process is performed to form an isolation region 104 on the portion of the substrate 100 exposed by the patterned insulating layer 106. The isolation region 104 isolates a high-voltage device region 102a from a low-voltage device region 102b. The method of forming the isolation region 104 comprises an oxide grown by wet oxidation to form a field oxide layer on the substrate 100.

Figure 1B:
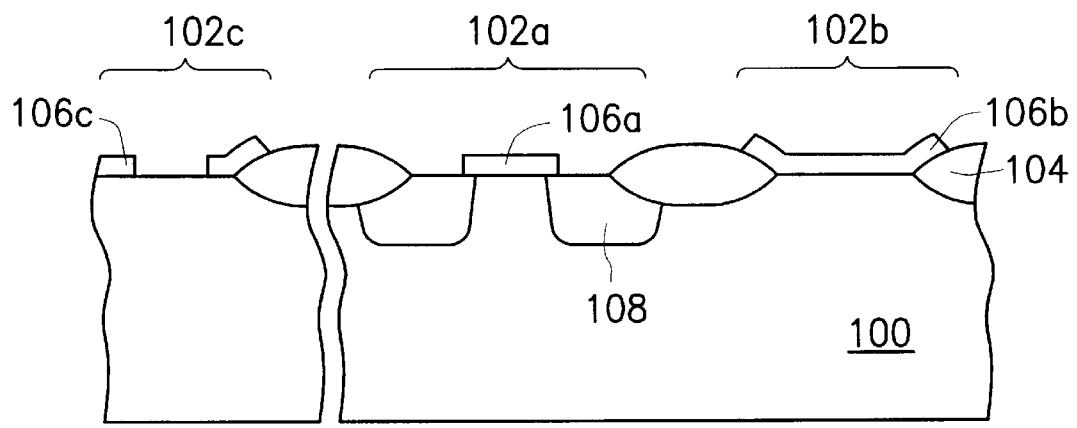

As shown in FIG. 1B, the patterned insulating layer 106 is patterned to form an insulating layer 106a in the high-voltage device region 102a, an insulating layer 106b in the low-voltage device region 102b and an insulating layer 106c in the scribe region 102c. The insulating layer 106a exposes a portion of the substrate 100 predetermined for forming a grate region. Moreover, the insulating layer 106c exposes a portion of the substrate 100 in the scribe region 102c. The patterns of the insulating layer 106a in the high-voltage device region 102a can be adjusted with the formation of a symmetrical high-voltage device or an asymmetrical high-voltage device. A grade region 108 is formed in the substrate 100 exposed by the insulating layer 106a and the isolation region 104. The method of forming the grade region 108 comprises the steps of performing an implantation process to form a doped region (not shown) in the substrate 100 near the surface thereof, and then performing a drive-in process to forwardly and laterally diffuse the doped ions in the doped region into the substrate 100 and the portion of the substrate 100 under the isolation region 104 to form the grade region 108. The doped ions in the implantation process can be phosphorus ions, for example. The formation of the grade region 108 in the high-voltage device region 102a is performed before the formation of the gate structure 112 (as shown in FIG. 1D) in the high-voltage device region 102a and the low-voltage device region 102b and the formation of the source/drain region 118b (as shown in FIG. 1E) are performed. Hence, the low-voltage device will not be affected by the drive-in process and the electrical instability problem of the low-voltage device can be overcome.

Figure 1C:
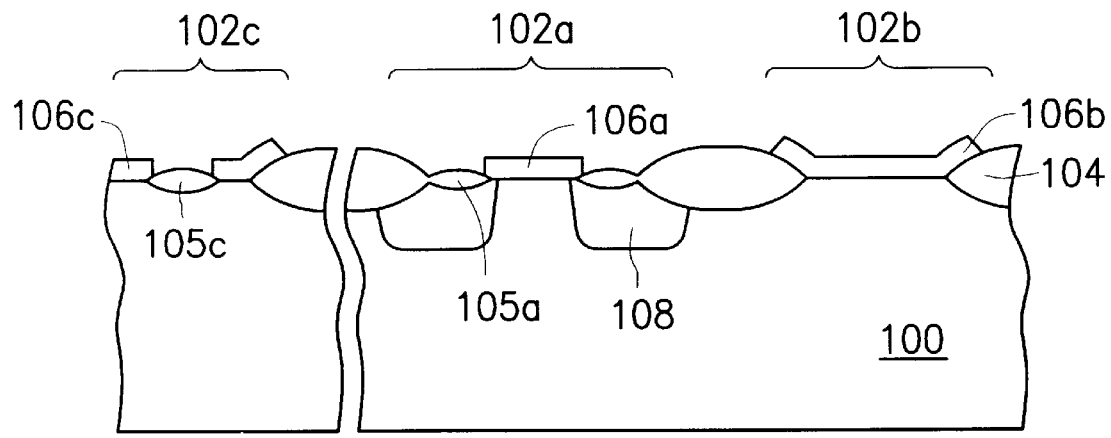
Figure 1D:
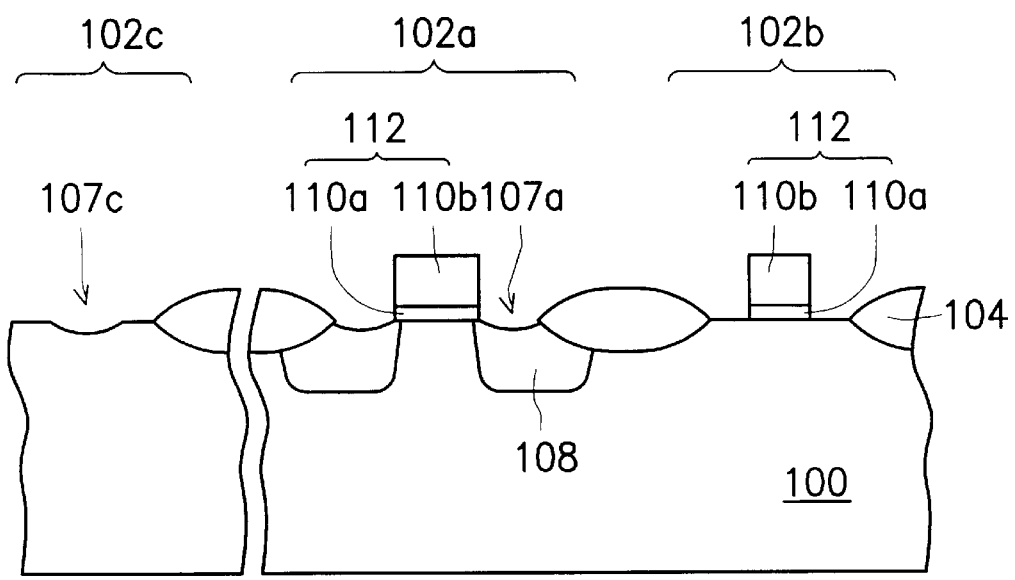
Figure 1E:
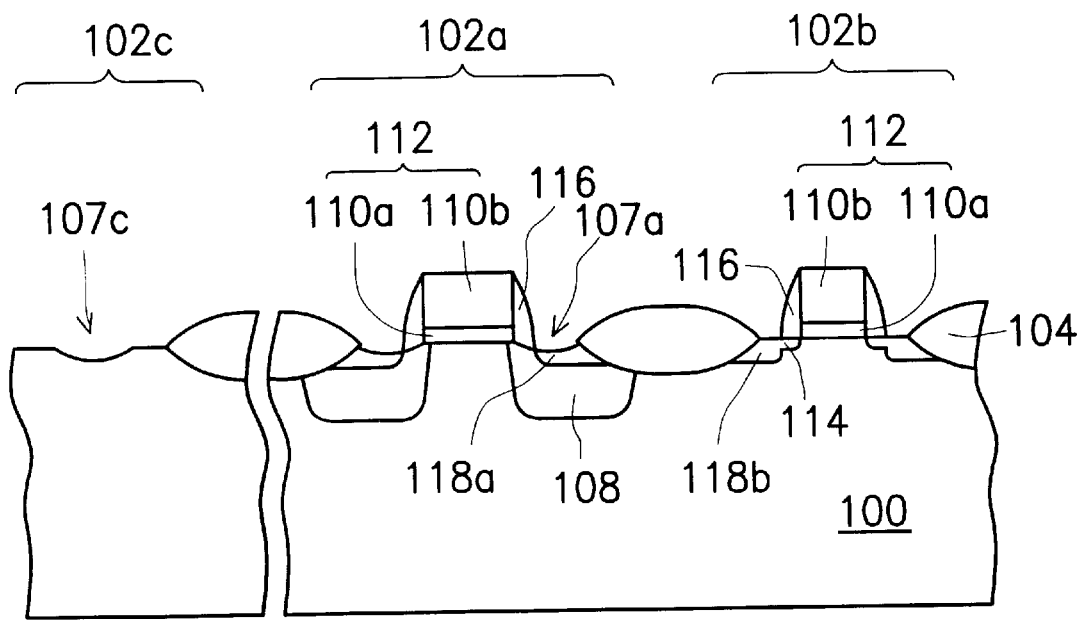

As shown in FIG. 1C, while using the insulating layers 106a and 106c as mask layers, protuberances 105a and 105c are respectively formed on the substrate 100 in the high-voltage device region 102a and the scribe region 102c. The protuberances 105a and 105c can be formed from silicon oxide by thermal oxidation, for example. The protuberances 105a and 105c will be removed to form recesses while the insulating layers 106a, 106b and 106c are removed in the subsequent process. Because the grade region 108 and the protuberances 105a and 105c are formed in a self-aligned process with the same insulating layers 106a and 106c as mask layers, the recess formed in the scribe region 102c after the protuberance 105c is removed can serve as an alignment mark and a vernier in the subsequent formation of the gate structure. Therefore, the subsequent formation of the gate structure is relatively accurately aligned. The thickness of the protuberances 105a and 105c can be varied with the depth-perception ability of the photolithography machine in the subsequent process.

As shown in FIG. 1D, the insulating layers 106a, 106b and 106c are removed. Simultaneously, the protuberances 105a and 1O5c are removed to respectively form recesses 107a and 107c. The insulating layers 106a, 106b and 106c and the protuberances 105a and 105c can be removed by wet etching, for example. While using the recesses 107a and 107c as alignment marks, an adjusting implantation process is performed. The adjusting implantation process comprises an anti-punch through ion implantation and a threshold voltage ion implantation, for example. While the recesses 107a and 107c as alignment marks and a vernier, gate structures 112 having a gate oxide layer 110a and a gate electrode 110b are formed on the substrate 100 in the high-voltage device region 102a and the low-voltage device region 102b. The gate structure 112 formed in the high-voltage device region 102a is located on a portion of the substrate 100 between the grade regions 108 and covers a portion of each grade region 108. The method of forming the gate structure 112 comprises the steps of forming an oxide layer (not shown) and a conductive layer (not shown) over the substrate 100 in sequence, and then patterning the conductive layer and the oxide layer to form the gate structures 112. The material of the gate electrode 110b includes polysilicon, for example. The recesses 107a and 107c and the grade region 108 are formed in a self-aligned process with the same insulating layers 106a and 106c as mask layers, so that the formation of the gate structure 112 in the high-voltage device region 102a are relatively accurately aligned.

As shown in FIG. 1E, a lightly doped drain (LDD) region 114 is formed in the substrate 100 exposed by the gate structure 112 in the low-voltage device region 102b. The dose of the LDD region 114 is about $1\times10^{13}/cm^2 - 5\times10^{13}/cm^2$. A spacer 116 is formed on the sidewall of the gate structure 112. The method of forming the spacer 116 comprises the steps of forming an insulating layer (not shown) over the substrate 100, and then removing a portion of the insulating layer to form the spacer 116 on the sidewall of the gate structure 112 by anisotropic etching. A heavily doped region 118a is formed in the substrate 100 exposed by the spacer 116 in the high-voltage device region 102a and the heavily doped region 118a merges with the grade region 108 to form a DDD structure. Simultaneously, a source/drain region 118b is formed in the substrate 100 exposed by the spacer 116 in the low-voltage device region 102b. The dose of the heavily doped region 118a and the source/drain region 118b is about $5\times10^{15}/cm^2$. An annealing process is performed to restore the crystal structure of the surface of the substrate 100.

In the invention, the grade region in the high-voltage device region and the recesses in the high-voltage device region and in the scribe region are formed in a self-aligned process with the same insulating layers as mask layers, so that the recesses can be used as alignment marks and a vernier in the subsequent adjusting implantation and formation of gate structure. Therefore, the procedures of performing the adjusting implantation and forming the gate structure relatively accurately aligned. Additionally, the grade region is formed before the gate structure. Hence, the low-voltage device will not be affected by the high temperature drive-in process and the electrical instability problem can be overcome.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a high-voltage device, comprising the steps of:

providing a substrate having a scribe region and a high-voltage device region, wherein a patterned insulating layer is formed on the substrate in the high-voltage device region and in the scribe region;

forming a grade region in the substrate exposed by the patterned insulating layer in the high-voltage device region;

forming a plurality of protuberances on the substrate exposed by the patterned insulating layer in the high-voltage device region and in the scribe region;

removing the patterned insulating layer and the protuberances to form a plurality of recesses at locations of the protuberances;

forming a gate structure on the substrate between the grade region while using the recesses as alignment marks;

forming a spacer on a sidewall of the gate structure; and forming a heavily doped region in the substrate exposed by the spacer, wherein the heavily doped region and the grade region together form a double diffused drain region.

2. The method of claim 1, wherein the step of forming the protuberances includes thermal oxidation.

3. The method of claim 1, further comprising a step of performing an adjusting implantation process while using the recesses as alignment marks, before the step of forming the gate structure.

4. The method of claim 3, wherein the adjusting implantation process includes an anti-punch through ion implantation.

5. The method of claim 3, wherein the adjusting implantation process includes a threshold voltage ion implantation.

6. The method of claim 1, further comprising a step of performing an annealing process, after the step of forming the heavily doped region.

7. The method of claim 1, wherein the method of forming the grade region comprises the steps of:

performing an implantation process to form a doped region in the substrate near a surface thereof exposed by the patterned insulating layer in the high-voltage device region; and performing an annealing process to transform the doped region into the grade region.

8. A method for integrating a high-voltage device and a low-voltage device, comprising the steps of:

providing a substrate having a high-voltage device region, a low-voltage device region and a scribe region, wherein the high-voltage device region is isolated from the low-voltage device region and a patterned insulating layer is formed on the substrate in the high-voltage device region and the scribe region;

forming a grade region in the substrate exposed by the patterned insulating layer in the high-voltage device region;

forming a plurality of protuberances on the substrate exposed by the patterned insulating layer in the high-voltage device region and in the scribe region;

removing the patterned insulating layer and the protuberances to form a plurality of recesses at locations of the protuberance;

forming a first gate structure and a second gate structure, respectively, on the substrate between the grade region in the high-voltage device region and on the substrate in the low-voltage device region while using the recesses as alignment marks;

forming a lightly doped region in the substrate exposed by the second gate structure in the low-voltage device region;

forming spacers on sidewalls of the first gate structure and the second gate structure; and forming a heavily doped region and a source/drain region, respectively, in the substrate exposed by the spacer in the high-voltage device region and the low-voltage device region, wherein the heavily doped region and the grade region together form a double diffused drain region.

9. The method of claim 8, wherein the step of forming the protuberances includes thermal oxidation.

10. The method of claim 8, further comprising a step of performing an adjusting implantation process while using the recesses as alignment marks, before the step of forming the first and the second gate structures.

11. The method of claim 10, wherein the adjusting implantation process includes an anti-punch through ion implantation.

12. The method of claim 10, wherein the adjusting implantation process includes a threshold voltage ion implantation.

13. The method of claim 8, further comprising a step of performing an annealing process, after the step of forming the heavily doped region and the source/drain region.

14. The method of claim 8, wherein the method of forming the grade region comprises the steps of:

performing an implantation process to form a doped region in the substrate near a surface thereof exposed by the patterned insulating layer in the high-voltage device region; and performing an annealing process to transform the doped region into the grade region.

* * * * *